(12) United States Patent
Wu et al.

(10) Patent No.: US 6,861,333 B2
(45) Date of Patent: Mar. 1, 2005

(54) METHOD OF REDUCING TRENCH ASPECT RATIO

(75) Inventors: Chang-Rong Wu, Taipei (TW); Seng-Hsiung Wu, Pingtung (TW); Yi-Nan Chen, Taipei (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 10/727,730

(22) Filed: Dec. 4, 2003

(65) Prior Publication Data

US 2004/0192010 A1 Sep. 30, 2004

(30) Foreign Application Priority Data

Mar. 28, 2003 (TW) ........................................ 92107052 A

(51) Int. Cl.[7] .............................................. H01L 21/76
(52) U.S. Cl. ..................... 438/424; 438/425; 438/435; 438/400; 438/404; 438/421
(58) Field of Search ................................ 438/424, 425, 438/435, 400, 404, 421; 257/622, 510

(56) References Cited

U.S. PATENT DOCUMENTS

| | | | | |
|---|---|---|---|---|
| 5,872,045 A | * | 2/1999 | Lou et al. ................... | 438/432 |
| 6,355,974 B1 | * | 3/2002 | Lin et al. .................... | 257/622 |
| 6,368,941 B1 | * | 4/2002 | Chen et al. .................. | 438/424 |
| 6,511,888 B1 | * | 1/2003 | Park et al. ................... | 438/296 |
| 6,537,914 B1 | * | 3/2003 | Park et al. ................... | 438/692 |
| 6,627,514 B1 | * | 9/2003 | Park et al. ................... | 438/435 |
| 6,713,365 B2 | * | 3/2004 | Lin et al. .................... | 438/424 |
| 2003/0104677 A1 | * | 6/2003 | Park et al. ................... | 438/424 |
| 2003/0162364 A1 | * | 8/2003 | Lin et al. .................... | 438/424 |
| 2003/0216007 A1 | * | 11/2003 | Lee et al. ................... | 438/424 |
| 2003/0224572 A1 | * | 12/2003 | Yang .......................... | 438/257 |

* cited by examiner

Primary Examiner—Matthew Smith
Assistant Examiner—Victor V Yevsikov
(74) Attorney, Agent, or Firm—Quintero Law Office

(57) ABSTRACT

A method of reducing trench aspect ratio. A trench is formed in a substrate. Using HDP-CVD, a conformal first oxide layer is formed on a surface of the trench. A conformal first nitride layer is formed on the first oxide layer. Part of the first nitride layer is removed to cause the first nitride layer to be lower than a top surface of the substrate. Using a BOE solution, the first nitride layer and part of the first oxide layer are removed to leave a remaining first oxide layer on the lower portion of the surface of the trench. Thus, the trench aspect ratio is reduced.

20 Claims, 9 Drawing Sheets

METHOD OF REDUCING TRENCH ASPECT RATIO

BACKGROUND OF THE INVENTION

1. Field of the Invention

The present invention relates to a semiconductor manufacturing process, and more particularly, to a method of reducing the aspect ratio of a trench.

2. Description of the Related Art

Semiconductor device geometry continues to decrease in size, providing more devices per fabricated wafer. Currently, some devices are fabricated with less than 0.25 $\mu$m spacing between features; in some cases there is as little as 0.18 $\mu$m spacing between features, which often takes the form of a trench.

An isolation technique called shallow trench isolation (STI) has been introduced to the fabrication of devices to reduce size. Isolation trenches are formed in a substrate between features, such as transistors. FIGS. 1A~1B are schematic views of a traditional STI process.

In FIG. 1A, a substrate 10 such as a silicon wafer is provided. A shield layer 11 comprising a pad oxide layer 12 and a silicon nitride layer 14 is formed on part of the substrate 10. The shield layer 11 serves as a stacked mask defining an isolation area in the substrate 10. The pad oxide layer 12 can be a $SiO_2$ layer with a thickness of 50~150 Å, formed by chemical vapor deposition (CVD) or thermal oxidation. The silicon nitride layer 14 can be a $Si_3N_4$ layer with a thickness of 800~1500 Å, formed by CVD.

In FIG. 1B, using the shield layer 11 as a mask, part of the substrate 10 is etched to form a trench 15. A thin oxide film 16, serving as a linear layer, is then formed by thermal oxidation, conformal to the surface of the trench 15. The thickness of the thin oxide film 16 is about 180~220 Å. Next, a trench-filling material such as a $SiO_2$ layer 18 is deposited in the trench 15 once with a conventional high-density plasma chemical vapor deposition (HDP-CVD). Typically, the HDP-CVD reaction gas includes $O_2$ and silane ($SiH_4$).

FIG. 1C shows that a void may form when a trench with a narrow gap is filled by a conventional process. For example, when the width of the trench 15 is less than 0.15 $\mu$m and/or the aspect ratio of the trench is greater than 4, a void 20 is easily formed in a $SiO_2$ layer 19 with the conventional process. Such a void 20 seriously affects device reliability and yield, and hinders reduction in semiconductor device geometry.

SUMMARY OF THE INVENTION

The object of the present invention is to provide a method of forming a shallow trench isolation (STI) in a substrate.

Another object of the present invention is to provide a method for lowering the aspect ratio of a trench during a deposition process to fill the trench without creating voids.

In order to achieve these objects, the present invention provides a method of reducing the aspect ratio of a trench. A trench is formed in a substrate. Using HDP-CVD, a conformal first oxide layer is formed on a surface of the trench. A conformal first nitride layer is formed on the first oxide layer. A portion of the first nitride layer is removed to cause the first nitride layer to be lower than a top surface of the substrate. Using a BOE solution, the first nitride layer and a portion of the first oxide layer are removed and thus leave a remaining first oxide layer on a lower portion of the surface of the trench.

Moreover, when the aspect ratio of the trench is high, subsequent to the above steps, at least one cycle of the following steps can be performed. Using HDP-CVD, a conformal second oxide layer is formed on the remaining first oxide layer and the surface of the trench. A conformal second nitride layer is formed on the second oxide layer. A portion of the second nitride layer is removed, thereby causing the second nitride layer to be lower than a top surface of the substrate. Using a BOE solution, the second nitride layer and a portion of the second oxide layer are removed and thus produce a remaining second oxide layer on the remaining first oxide layer. Thus, the aspect ratio can be further reduced.

The present invention improves on the related art in that the present method leaves an oxide layer on the lower surface of the trench and thus produces a dual "U" shaped trench rather than the conventional single "U" shaped trench. Thus, the invention can reduce the aspect ratio of the trench, thereby preventing void formation during trench filling and ameliorating the disadvantages of the related art.

BRIEF DESCRIPTION OF THE DRAWINGS

The present invention can be more fully understood by reading the subsequent detailed description in conjunction with the examples and references made to the accompanying drawings, wherein.

DETAILED DESCRIPTION OF THE INVENTION

A preferred embodiment of the invention will now be described in detail with reference to the accompanying drawings.

FIGS. 2~12 are sectional views showing the trench isolation process of the present invention.

Figure 1A:
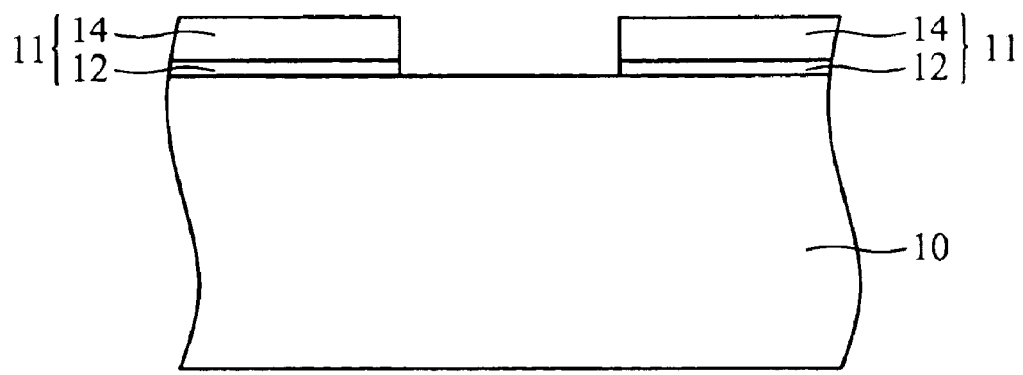
FIGS. 1A~1B are sectional views according to the conventional STI process.
Figure 1B:
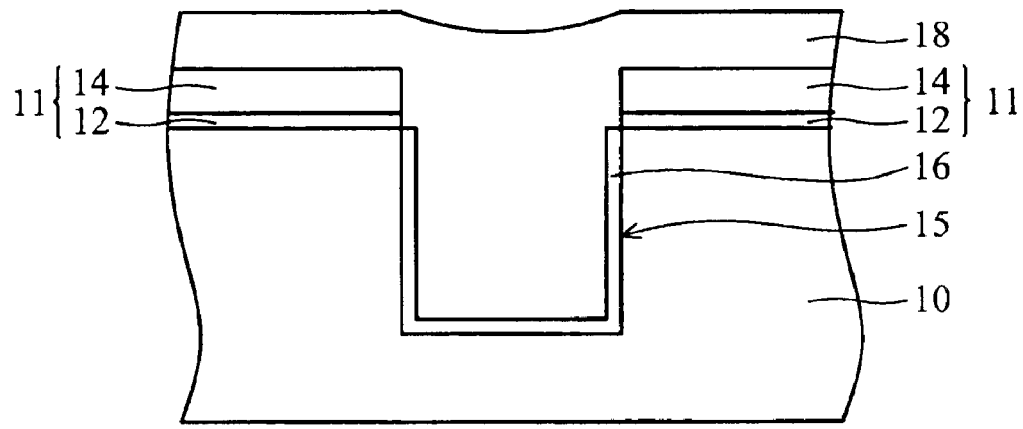
Figure 1C:
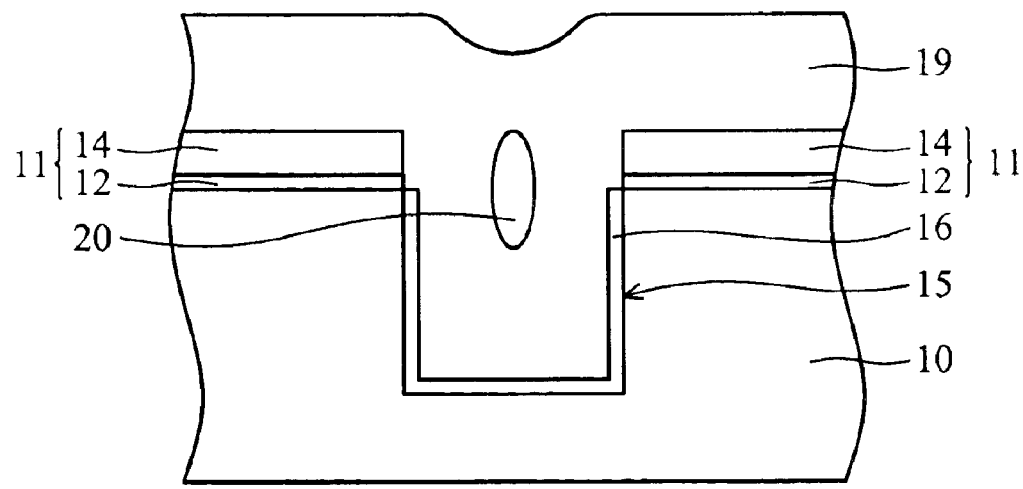
FIG. 1C is a schematic view, according to the conventional STI process, that forms a void in a trench.
Figure 2:
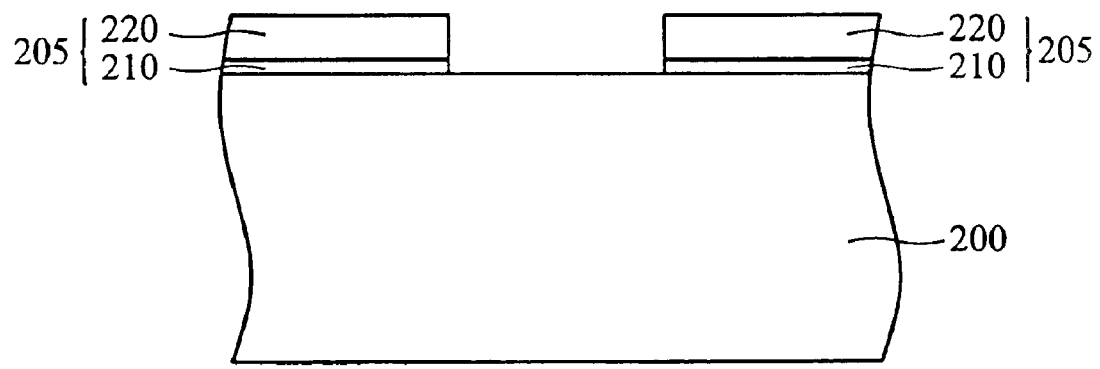
FIGS. 2~12 are sectional views according to an embodiment of the present invention.

In FIG. 2, a semiconductor substrate 200, such as a silicon wafer, is provided. A shield layer 205 preferably comprising a pad oxide layer 210 and a silicon nitride layer 220 is formed on part of the substrate 200. The pad oxide layer 210 can be a $SiO_2$ layer formed by thermal oxidation or CVD (chemical vapor deposition). The silicon nitride layer 220 can be a $Si_3N_4$ layer formed by CVD. For example, the thickness of the pad oxide layer 210 is about 100 Å and the thickness of the silicon nitride layer 220 is about 900 Å. The shield layer 205 serves as a stacked mask for defining an isolation area in the substrate 200.

Figure 3:
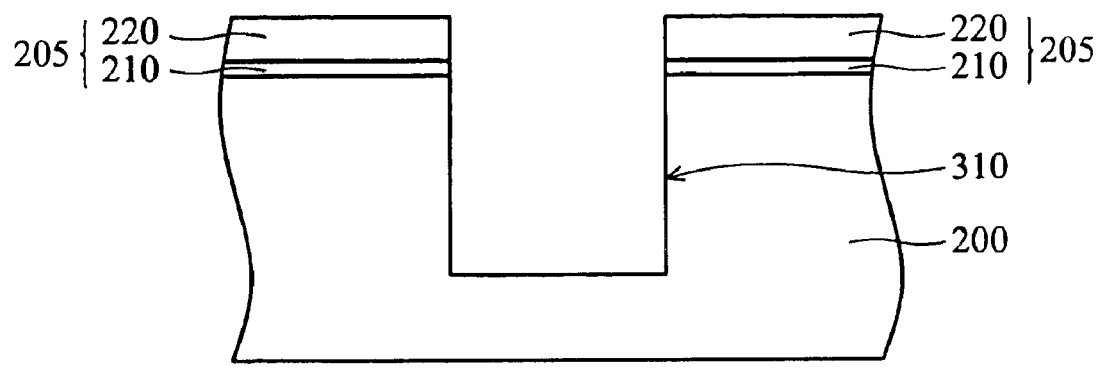

In FIG. 3, using the shield layer 205 as a mask, part of the substrate 200 is etched to form a trench 310. The depth of the trench 310 is, for example, 2600~5000 Å. Moreover, a thin oxide film (not shown), such as a $SiO_2$ film, can be conformably formed on the side and the bottom of the trench 310 by thermal oxidation. The thin oxide film (not shown) of about 180~220 Å in thickness serves as a linear layer. In order to simplify the illustration, the thin oxide film (or the linear layer) is not shown in FIGS. 2~12.

Figure 4:
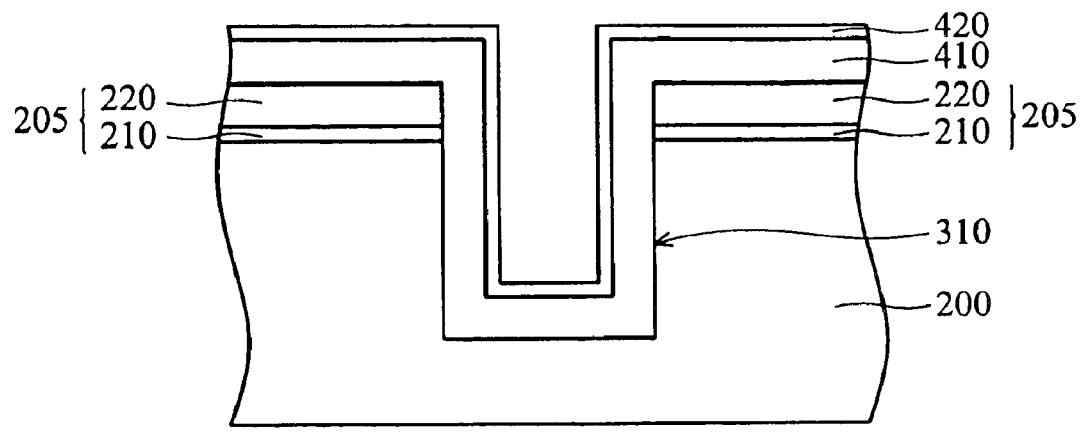

In FIG. 4, using HDP-CVD, a conformal first oxide layer 410, such as a $SiO_2$ layer, is formed on the surface of the trench 310. The thickness of the first oxide layer 410 is about 200~300 Å. It is noted that, because of HDP-CVD, the structure of the first oxide layer 410 is adequately dense. The conditions of the HDP-CVD comprise, for example, the process gas using $SiH_4$ and $O_2$ and as ratio of $SiH_4/O_2$ with about 1.5~2, an operational temperature of about 550~650° C. and an operational pressure of about 5 m torr.

In FIG. 4, a conformal first nitride layer 420, such as a $Si_3N_4$ layer, is formed on the first oxide layer 410 by, for example, low pressure chemical vapor deposition (LP-CVD). The thickness of the first nitride layer 420 is about 40~50 Å.

Figure 5:
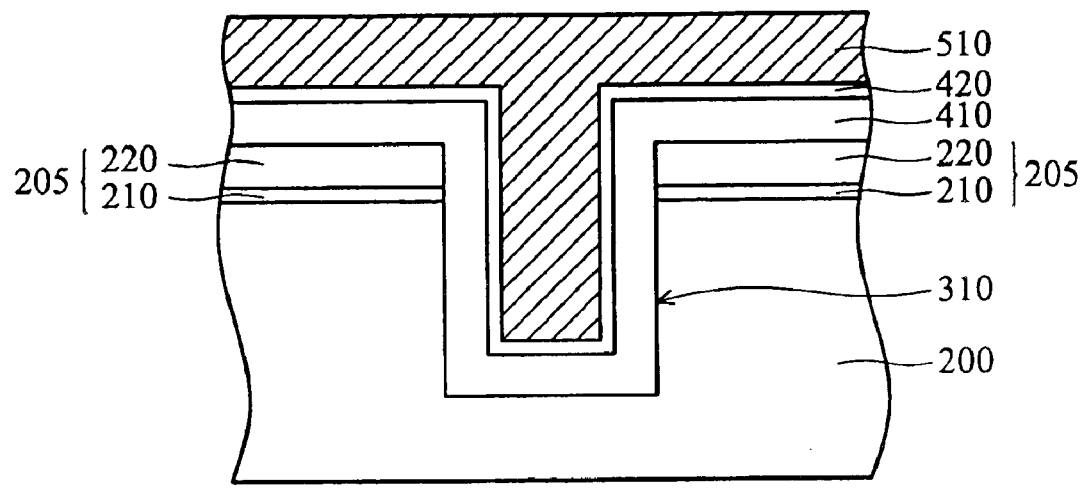
Figure 6:
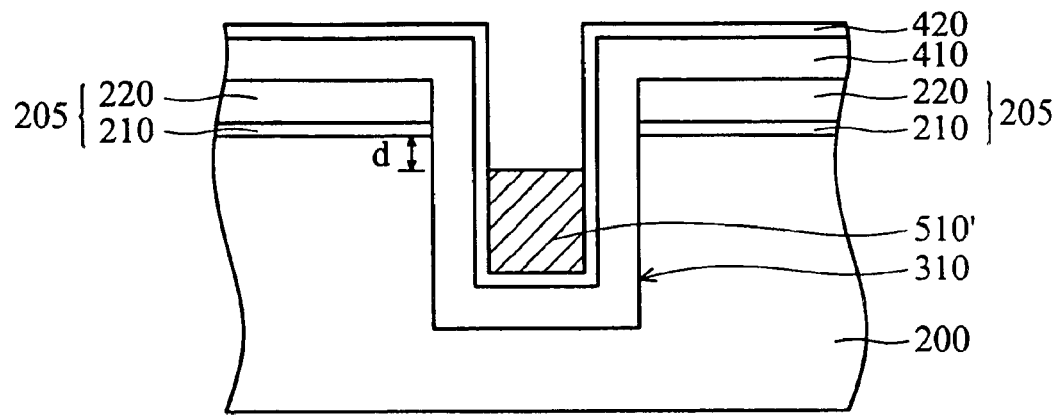

In FIGS. 5 and 6, the trench 310 is filled with a photoresist layer 510. The photoresist layer 510 is then partially etched back to form a first photoresist layer 510' (i.e. a remaining photoresist layer 510') in the trench 310 and covers part of the first nitride layer 420. It is noted that the first photoresist layer 510' is at least 1000 Å lower than a top surface of the substrate 200. The symbol "d" shown in FIG. 6 indicates the distance (at least 1000 Å) between the first photoresist layer 510' and the top surface of the substrate 200.

Figure 7:
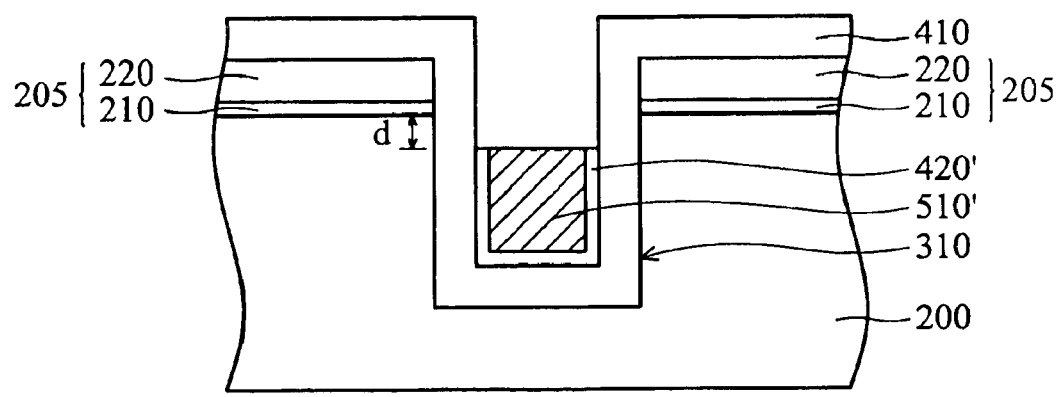

In FIG. 7, using the first photoresist layer 510' as a mask, the exposed portion of the first nitride layer 420 is removed to leave a remaining first nitride layer 420'. Similarly, the remaining first nitride layer 420' is at least 1000 Å lower than the top surface of the substrate 200.

Figure 8:
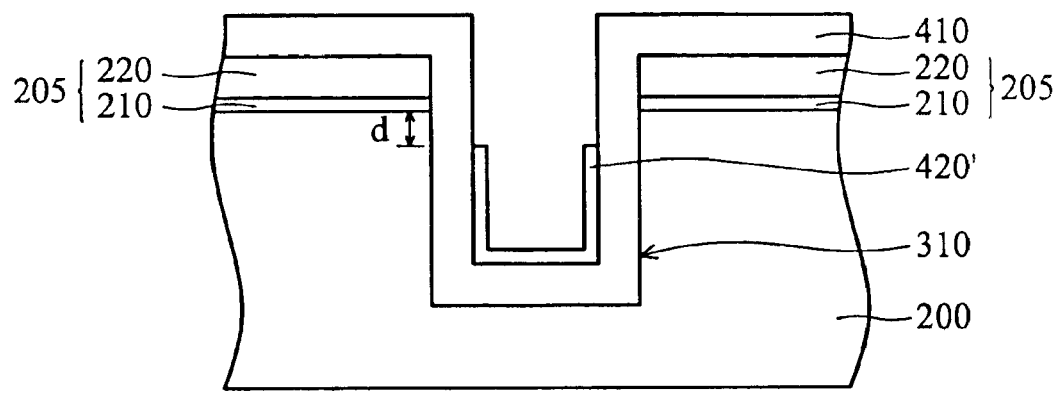

In FIG. 8, the first photoresist layer 510' is then removed.

Figure 9:
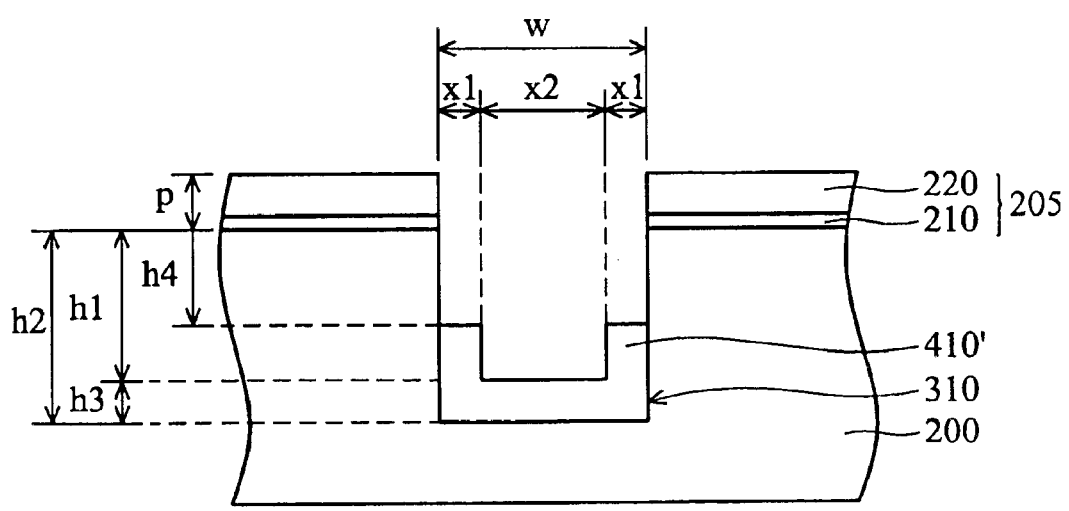

In FIG. 9, using a BOE (buffer oxide etcher) solution, the first nitride layer 420' and part of the first oxide layer 410 are removed to leave a remaining first oxide layer 410' on the lower surface of the trench 310.

As an operational example, the etching procedure uses a BOE solution consisting of $NH_4F(40\%)$, HF(49%) and deionized water (DI). The volume ratio of $NH_4F/HF/DI$ is about 5/1/48. In this example, the etching rate of the first oxide layer 410 with the BOE solution is about 280~320 Å/min and the etching rate of the remaining first nitride layer 420' is about 8~12 Å/min. When the remaining first nitride layer 420' is thoroughly removed, the etching procedure halts. The remaining first oxide layer 410' is thus left on the lower surface of the trench 310, thereby reducing the aspect ratio of the trench 310.

Here, a demonstration of the present invention is provided, illustrating the reduced trench aspect ratio. Subsequent to the present process, referring to FIG. 9, it is assumed that:

p=1000 Å, w=800 Å, x1=200 Å, x2=400 Å, h1=2650 Å, h2=2900 Å, h3=250 Å, h4=2000 Å.

The original aspect ratio (AR)
=(h2+p)/w=3900/800
=4.87

Subsequent to the present process, the aspect ratio (AR')
=AR*[(h1−h4)*x2+(h4+p)*w/(h2+p)*w]/[(h2+p)*w]
=4.87*[(650*400+3000*800)/(3900*800)]
=4.87*0.85
=4.14

Moreover, when the aspect ratio of the trench is very high, at least one cycle of the following steps as shown as FIGS. 13~17, which are similar to FIGS. 4~9, can be performed to further reduce the aspect ratio.

Figure 13:
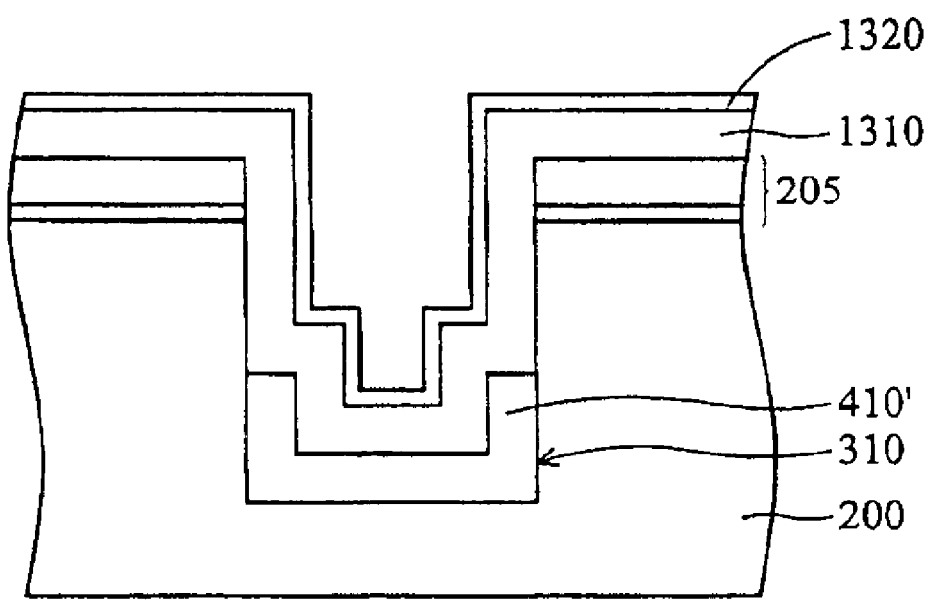
FIGS. 13~17 are sectional views, which illustrate additional steps of the invention to further reduce the aspect ratio of a trench.

Please refer to FIG. 13 which is similar to FIG. 4. Using HDP-CVD, a conformal second oxide layer 1310 is formed on the remaining first oxide layer 410' and the surface of the trench 310.

Please refer to FIG. 13 which is Using LP-CVD, a conformal second nitride layer 1320 is formed on the second oxide layer 1310

Figure 14:
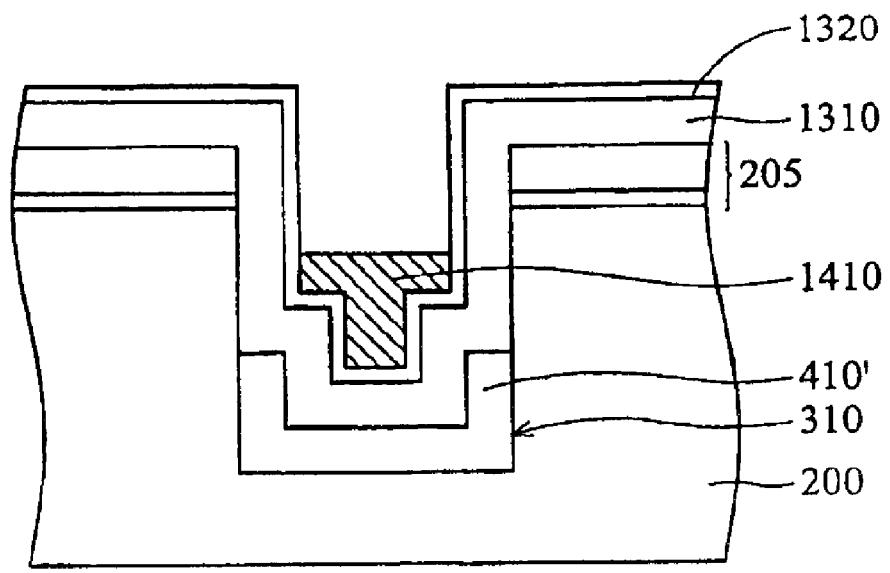

Please refer to FIG. 14 which is similar to FIGS. 5 and 6. A photoresist recess procedure is performed. That is, a second photoresist layer 1410 is formed in part of the trench 310 to cover part of the second nitride layer 1320. The second photoresist layer 1410 is at least 1000 Å lower than the top surface of the substrate 200.

Figure 15:
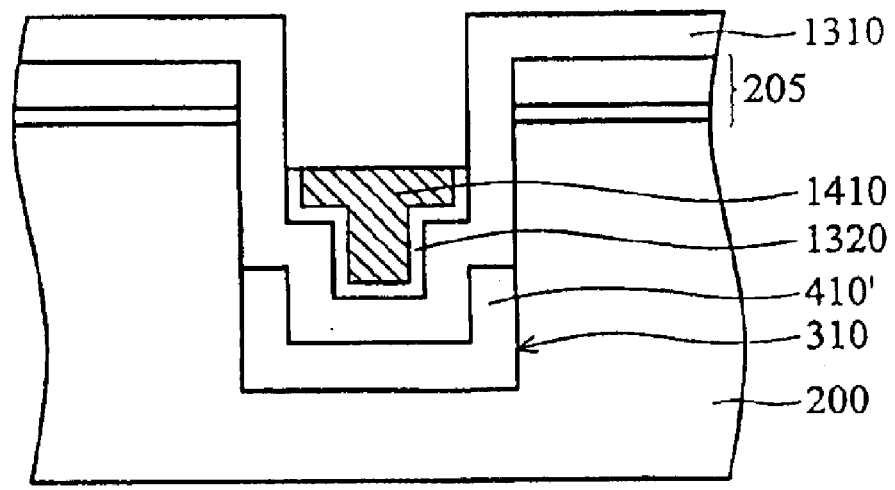

Please refer to FIG. 15 which is similar to FIG. 7. Using the second photoresist layer 1410 as a mask, part of the second nitride layer 1320 is then removed.

Figure 16:
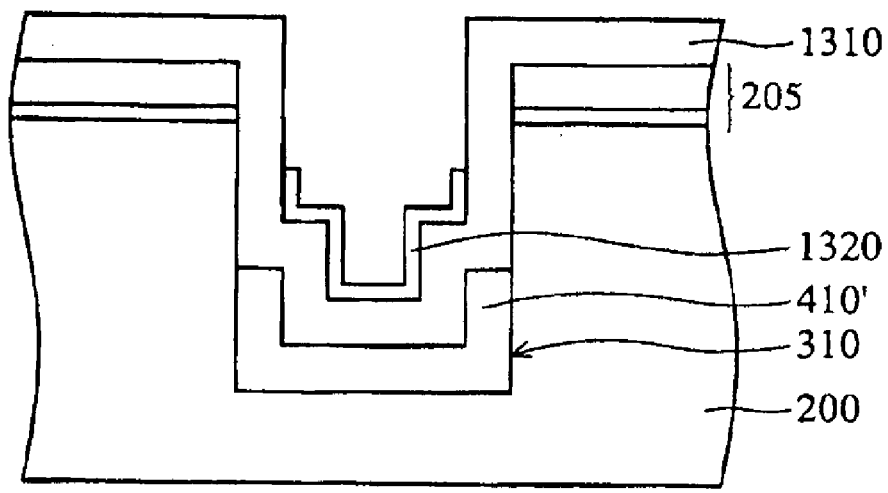

Please refer to FIG. 16 which is similar to FIG. 8. The second photoresist layer 1410 is removed.

Figure 17:
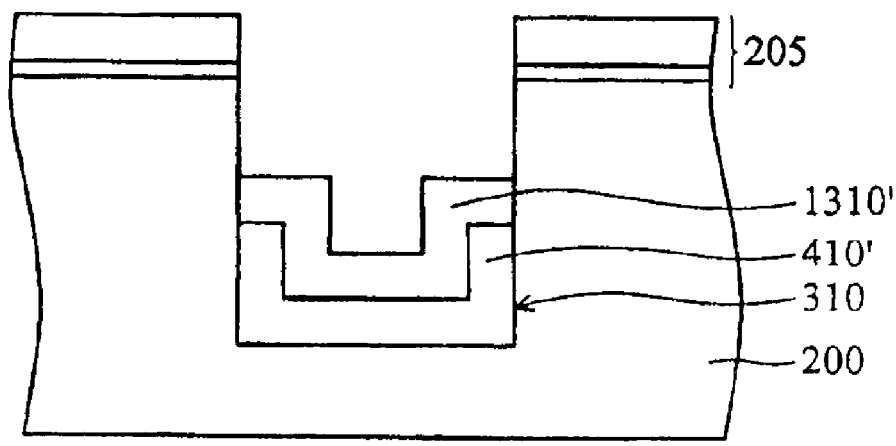

Please refer to FIG. 17 which is similar to FIG. 9. Using the BOE solution, the second nitride layer 1320 and part of the second oxide layer 1310 are removed to leave a remaining second oxide layer 1310 ' on the remaining first oxide layer 410'. Consequently, the aspect ratio of the trench 310 can be further reduced.

Figure 10:
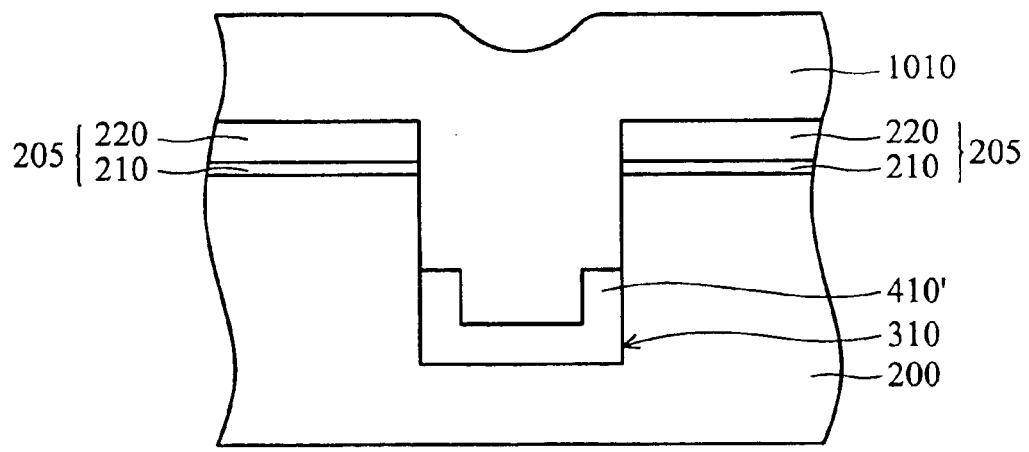

Next, referring to FIG. 10, using HDP-CVD or TEOS-CVD, the trench 310 is filled with an insulation layer 1010 extending onto the shield layer 205. The insulation layer 1010 is, for example, a $SiO_2$ layer. Due to the lower aspect ratio of the trench 310 according to the present method, void-free deposition is easily achieved.

Figure 11:
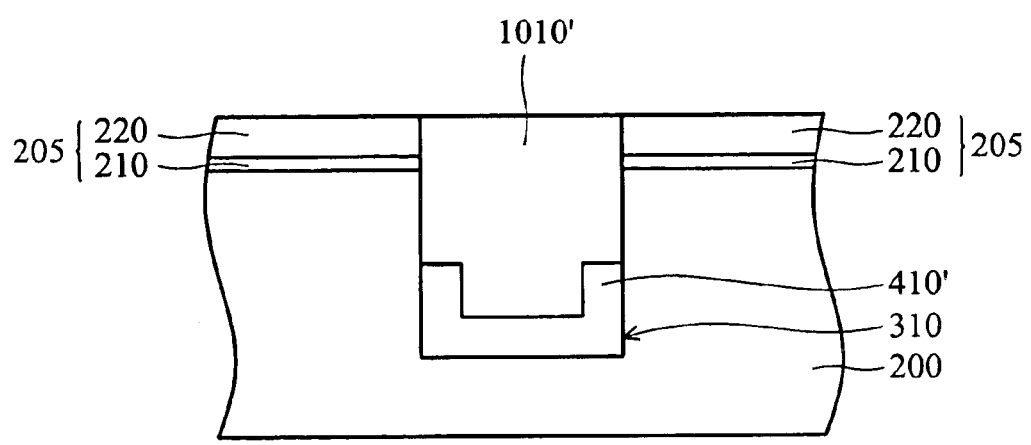

In FIG. 11, a planarization such as chemical mechanical polishing (CMP) is performed on the insulation layer 1010 to produce a smooth insulation layer 1010', wherein the shield layer 205 serves as a stop layer for the planarization.

Figure 12:
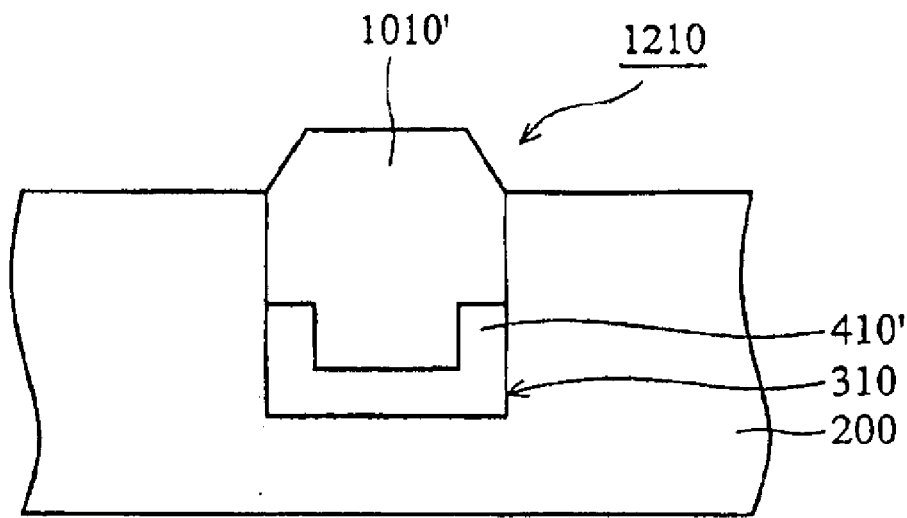

In FIG. 12, the silicon nitride layer 220 is removed by, for example, a phosphoric acid solution. The pad oxide layer 210 is removed by, for example, an HF solution. Thus, a void-free STI profile 1210 is formed.

Thus, the present invention provides a method of forming a void-free STI in a substrate, and a method of lowering the aspect ratio of a trench during a deposition process of filling the trench. Additionally, the present invention significantly improves the reliability of the product and achieves the goal of reduction in IC size.

Finally, while the invention has been described by way of example and in terms of the above, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A method of reducing an aspect ratio of a trench, comprising the steps of:

forming a trench in a substrate;

using HDP-CVD to form a conformal first oxide layer on a surface of the trench;

forming a conformal first nitride layer on the first oxide layer;

removing part of the first nitride layer to cause the first nitride layer to be lower than a top surface of the substrate; and using a BOE solution to remove the first nitride layer and part of the first oxide layer, thus forming a remaining first oxide layer on the surface of the trench at a lower portion.

2. The method according to claim 1, further comprising at least one cycle of the steps of:

using HDP-CVD to form a conformal second oxide layer on the remaining first oxide layer and the surface of the trench;

forming a conformal second nitride layer on the second oxide layer;

removing part of the second nitride layer to cause the second nitride layer to be lower than a top surface of the substrate; and using a BOE solution to remove the second nitride layer and part of the second oxide layer, thus forming a remaining second oxide layer on the remaining first oxide layer.

3. A method of reducing an aspect ratio of a trench, comprising the steps of:

(a) providing a substrate;

(b) forming a trench in the substrate;

(c) using HDP-CVD to form a conformal first oxide layer on a surface of the trench;

(d) forming a conformal first nitride layer on the first oxide layer;

(e) forming a first photoresist layer in part of the trench to cover part of the first nitride layer, wherein the first photoresist layer is lower than a top surface of the substrate;

(f) using the first photoresist layer as a mask, removing part of the first nitride layer;

(g) removing the first photoresist layer; and (h) using a BOE solution to remove the first nitride layer and part of the first oxide layer, thus forming a remaining first oxide layer on the surface of the trench at a lower portion.

4. The method according to claim 3, further comprising at least one cycle of the steps of:

(i) using HDP-CVD to form a conformal second oxide layer on the remaining first oxide layer and the surface of the trench;

(j) forming a conformal second nitride layer on the second oxide layer;

(k) forming a second photoresist layer in part of the trench to cover part of the second nitride layer, wherein the second photoresist layer is lower than a top surface of the substrate;

(l) using the second photoresist layer as a mask, removing part of the second nitride layer;

(m) removing the second photoresist layer; and (n) using the BOE solution to remove the second nitride layer and part of the second oxide layer, thus forming a remaining second oxide layer on the remaining first oxide layer.

5. The method according to claim 4, wherein the second photoresist layer is at least 1000 Å lower than a top surface of the substrate.

6. The method according to claim 3, wherein the first photoresist layer is at least 1000 Å lower than a top surface of the substrate.

7. The method according to claim 3, wherein the formation of the trench comprises the steps of:

forming a shield layer on part of the substrate; and using the shield layer as a mask, etching part of the substrate to define the trench therein.

8. The method according to claim 7, wherein the shield layer comprises a pad oxide layer and a silicon nitride layer.

9. The method according to claim 3, further comprising, prior to forming the first oxide layer, a step of:

forming a conformal linear layer on the surface of the trench.

10. The method according to claim 3, wherein the first oxide layer is a $SiO_2$ layer.

11. The method according to claim 3, wherein the nitride layer is a $Si_3N_4$ layer formed by LP-CVD.

12. The method according to claim 3, wherein an etching rate of the first oxide layer with the BOE solution is 280~320 Å/min, and an etching rate of the first nitride layer with the BOE solution is 8~12 Å/min.

13. The method according to claim 12, wherein a thickness of the first oxide layer is 200~300 Å, and a thickness of the first nitride layer is 40~50 Å.

14. A method of reducing an aspect ratio of a trench, comprising the steps of:

(a) providing a silicon substrate;

(b) forming a trench in the silicon substrate (c) using HDP-CVD to form a conformal first oxide layer on a surface of the trench, wherein a thickness of the first oxide layer is 200~300 Å;

(d) forming a conformal first nitride layer on the first oxide layer, wherein a thickness of the first nitride layer is 40~50 Å;

(e) forming a first photoresist layer in part of the trench to cover part of the first nitride layer, wherein the first photoresist layer is at least 1000 Å lower than a top surface of the substrate;

(f) using the first photoresist layer as a mask, removing part of the first nitride layer;

(g) removing the first photoresist layer; and (h) using a BOE solution to remove the first nitride layer and part of the first oxide layer, thus forming a remaining first oxide layer on the surface of the trench at a lower portion, wherein an etching rate of the first oxide layer with the BOE solution is 280~320 Å/min, and an etching rate of the first nitride layer with the BOE solution is 8~12 Å/min.

15. The method according to claim 14, further comprising at least one cycle of the steps of:

(i) using HDP-CVD to form a conformal second oxide layer on the remaining first oxide layer and the surface of the trench;

(j) forming a conformal second nitride layer on the second oxide layer;

(k) forming a second photoresist layer in part of the trench to cover part of the second nitride layer, wherein the second photoresist layer is at least 1000 Å lower than a top surface of the substrate;

(l) using the second photoresist layer as a mask, removing part of the second nitride layer;

(m) removing the second photoresist layer; and (n) using the BOE solution to remove the second nitride layer and part of the second oxide layer, thus forming a remaining second oxide layer on the remaining first oxide layer.

16. The method according to claim 14, wherein the formation of the trench comprises the steps of:

forming a shield layer on part of the silicon substrate; and using the shield layer as a mask, etching part of the silicon substrate to define the trench therein.

17. The method according to claim 16, wherein the shield layer comprises a pad oxide layer and a silicon nitride layer.

18. The method according to claim 14, further comprising, prior to forming the first oxide layer, a step of:

forming a conformal linear layer on the surface of the trench.

19. The method according to claim 14, wherein the first oxide layer is a $SiO_2$ layer.

20. The method according to claim 14, wherein the nitride layer is a $Si_3N_4$ layer formed by LP-CVD.

* * * * *